(12) United States Patent
Larsson et al.

(10) Patent No.: US 10,305,212 B2
(45) Date of Patent: May 28, 2019

(54) CONNECTOR APPARATUS FOR A FIELD DEVICE AS WELL AS FIELD DEVICE WITH SUCH A CONNECTOR APPARATUS

(71) Applicant: Endress + Hauser Flowtec AG, Reinach (CH)

(72) Inventors: Bjorn Larsson, Birsfelden (CH); Timo Kretzler, Binzen (DE); Alfred Umkehrer, Hopferau (DE); Michael Kirst, Lorrach (DE)

(73) Assignee: ENDRESS + HAUSER FLOWTEC AG, Reinach (CH)

( * ) Notice: Subject to any disclaimer, the term of this patent is extended or adjusted under 35 U.S.C. 154(b) by 0 days.

(21) Appl. No.: 15/031,001

(22) PCT Filed: Sep. 10, 2014

(86) PCT No.: PCT/EP2014/069276
§ 371 (c)(1),
(2) Date: Apr. 21, 2016

(87) PCT Pub. No.: WO2015/058897
PCT Pub. Date: Apr. 30, 2015

(65) Prior Publication Data
US 2016/0254609 A1    Sep. 1, 2016

(30) Foreign Application Priority Data
Oct. 23, 2013 (DE) .......... 10 2013 111 696

(51) Int. Cl.
*H01R 13/62* (2006.01)
*H01R 24/00* (2011.01)
(Continued)

(52) U.S. Cl.
CPC ............ *H01R 13/111* (2013.01); *G08C 19/00* (2013.01); *H01R 13/447* (2013.01);
(Continued)

(58) Field of Classification Search
CPC .. H01R 13/111; H01R 13/639; H01R 13/447; H01R 13/5213; H01R 13/533;
(Continued)

(56) References Cited

U.S. PATENT DOCUMENTS 3,659,248 A    4/1972 Mann
4,100,517 A *  7/1978 Rodolfi ................ H01H 50/042
                                                        335/132
(Continued)

FOREIGN PATENT DOCUMENTS

DE    29603161 U1    6/1996
EP     0619627 A1   10/1994
(Continued)

OTHER PUBLICATIONS

German Search Report, German Patent Office, Munich, dated Feb. 19, 2014.
(Continued)

*Primary Examiner* — Amy Cohen Johnson
*Assistant Examiner* — Milagros Jeancharles
(74) *Attorney, Agent, or Firm* — Bacon & Thomas, PLLC

(57) ABSTRACT

A connection apparatus comprises a platform, a plug connector having a plug connector part secured to the platform and electrically connected to the circuit of the field device and a plug connector part connectable with the connection cable and complementary to the first plug connector part, as well as a lid held movably relative to the platform for at least partially covering the plug connector formed by connecting the plug connector parts. The lid is swingable between a first end position, in which the lid at least partially covers the plug connector, and a second end position, and is additionally adapted in at least one open position located between the first end position and the second end position to expose the plug connector such that the plug connector part can be (Continued)

separated from the plug connector part, as well as at least in the first end position to secure the plug connector part connected with the plug connector part.

11 Claims, 11 Drawing Sheets

(51) Int. Cl.
| | | |
|---|---|---|
| *H01H 9/02* | (2006.01) | |
| *H01R 13/11* | (2006.01) | |
| *H01R 13/447* | (2006.01) | |
| *H01R 13/52* | (2006.01) | |
| *H01R 13/639* | (2006.01) | |
| *G08C 19/00* | (2006.01) | |
| *H01R 43/26* | (2006.01) | |
| *H01R 105/00* | (2006.01) | |
| *G01R 1/04* | (2006.01) | |
| *H01R 13/533* | (2006.01) | |
| *H01R 24/30* | (2011.01) | |

(52) U.S. Cl.
CPC ....... *H01R 13/5213* (2013.01); *H01R 13/639* (2013.01); *H01R 43/26* (2013.01); *G01R 1/0416* (2013.01); *G08C 2200/00* (2013.01); *H01R 13/533* (2013.01); *H01R 24/30* (2013.01); *H01R 2105/00* (2013.01); *H01R 2201/20* (2013.01)

(58) Field of Classification Search
CPC .... H01R 43/26; H01R 2201/20; H01R 24/30; H01R 9/09; H01R 9/22; H01R 13/46; H01R 13/52; H01R 13/527; H01R 13/53; H01R 13/56; H01R 13/70; H01R 13/62; H01R 43/18; H01R 4/5066; H01R 12/88; H01R 13/5816; H01R 13/5829; H01R 13/6271; H01R 13/688; H01R 13/696; H02G 3/08; H02G 3/081; H02G 3/083; H02G 3/22; H05K 5/00; H05K 5/02; H05K 5/0217; H05K 5/0004; H01H 71/08; H01H 71/0228; H01H 9/342
USPC ................ 439/911, 373, 144, 372, 732, 729; 439/620.21; 335/202, 132, 133, 156
See application file for complete search history.

(56) References Cited

U.S. PATENT DOCUMENTS

| | | | | |
|---|---|---|---|---|
| 4,915,638 A | * | 4/1990 | Domian | H02G 3/14 174/67 |
| 5,425,653 A | * | 6/1995 | Koiso | H01R 13/6272 439/347 |
| 5,603,623 A | | 2/1997 | Nishikawa | |
| 5,606,299 A | * | 2/1997 | Innes | H01H 50/021 335/132 |
| 5,906,497 A | * | 5/1999 | Pham | G06F 1/184 361/679.46 |
| 6,811,425 B1 | * | 11/2004 | Chiang | H01R 9/24 439/372 |
| 7,009,126 B2 | * | 3/2006 | Etscheidt | H01H 9/0264 200/293 |
| 7,195,512 B2 | * | 3/2007 | Jenkinson | H01R 13/6395 439/372 |
| 8,288,651 B2 | * | 10/2012 | Smith | H01R 13/5205 174/135 |
| 8,876,539 B2 | * | 11/2014 | Gette | H01R 13/453 439/137 |
| 9,060,427 B2 | * | 6/2015 | Binner | H05K 5/0247 |
| 9,071,020 B2 | * | 6/2015 | Temmesfeld | B60L 11/1818 |
| 9,437,959 B2 | * | 9/2016 | Sathyanarayana | H01R 25/006 |
| 2005/0202706 A1 | * | 9/2005 | Bonavia | H01R 13/6271 439/296 |
| 2007/0232117 A1 | * | 10/2007 | Singer | H01R 4/18 439/352 |
| 2009/0088010 A1 | | 4/2009 | Smith | |
| 2009/0325423 A1 | * | 12/2009 | Bollinger | H01H 50/021 439/638 |
| 2010/0108374 A1 | * | 5/2010 | Korcz | H02B 1/52 174/520 |
| 2013/0309897 A1 | * | 11/2013 | Jodon De Villeroche | H01R 13/62922 439/345 |
| 2013/0341083 A1 | * | 12/2013 | Binner | H05K 5/0247 174/541 |
| 2015/0044896 A1 | * | 2/2015 | Davies | H01R 13/62 439/345 |
| 2015/0221421 A1 | * | 8/2015 | Valenti | H01R 4/2416 439/372 |

FOREIGN PATENT DOCUMENTS

| | | | | |
|---|---|---|---|---|
| GB | 1580037 | | 11/1980 | |
| GB | 1580037 A | * | 11/1980 | ............. H02G 3/081 |
| JP | 2007037220 A | | 2/2007 | |
| WO | 2011073758 A1 | | 6/2011 | |

OTHER PUBLICATIONS

International Search Report, EPO, The Netherlands, dated Dec. 14, 2014.

English Translation of the International Preliminary Report on Patentability, WIPO, Geneva, CH, dated May 6, 2016.

* cited by examiner

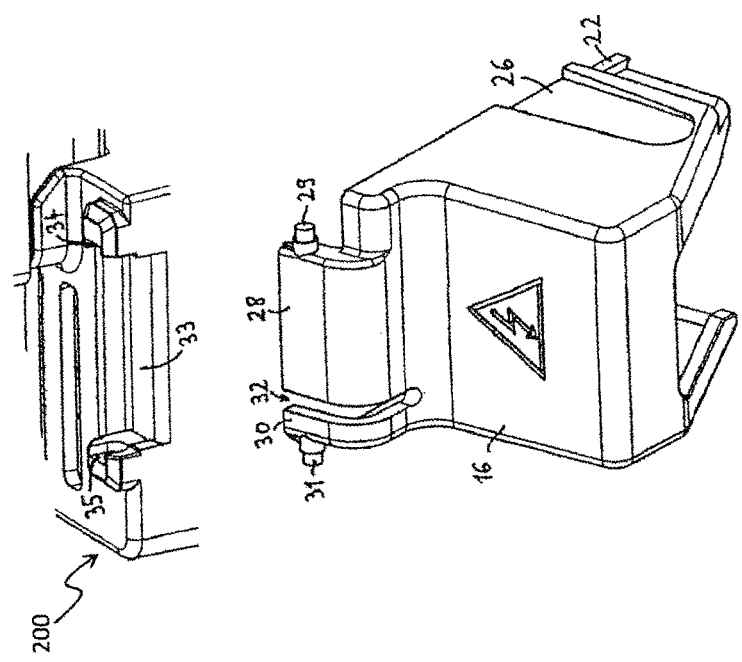

CONNECTOR APPARATUS FOR A FIELD DEVICE AS WELL AS FIELD DEVICE WITH SUCH A CONNECTOR APPARATUS

TECHNICAL FIELD

The invention relates to a connector apparatus for a field device as well as to a field device with a connector apparatus. Moreover, the invention relates to a method for connecting at least one electrical connection line to such a field device.

BACKGROUND DISCUSSION

Applied in industrial process-measurements technology, especially also in connection with the automation of chemical processes or procedures for producing a product from a raw or starting material by use of chemical, physical or biological processes and/or the automated control of industrial plants, are so-called field devices, namely electrical measuring- and/or switching devices installed directly at the respective plant, i.e. devices such as e.g. Coriolis mass flow measuring devices, density measuring devices, magneto inductive flow measuring devices, vortex flow measuring devices, ultrasonic, flow measuring devices, thermal mass flow measuring devices, pressure measuring devices, fill level measuring devices, fill level limit switches, temperature measuring devices, pH-value measuring devices, etc., which serve for producing analog or, for example, also digital, measured values representing process measurement variables as well as measured value signals lastly carrying these values. The respective process measurement variables to be registered include, depending on application, for example, mass flow, density, viscosity, fill level or limit level, pressure or temperature or the like, of a liquid, powdered, vaporous or gaseous medium conveyed, respectively held, in a corresponding container, such as e.g. a pipeline or a tank.

For registering the respective process measurement variable and for transducing the same into an electrical measurement signal corresponding therewith, field devices have, in each case, a corresponding physical to electrical or chemical to electrical, measuring transducer, which is applied most often directly in a wall of the container holding the medium or in the course of a line, for example, a pipeline, conveying the medium. For processing the measurement signal, the measuring transducer is further connected with an electronics of the field device serving for further processing or evaluation of the at least one measurement signal, as well as also generating corresponding measured values. The electronics is typically electrically connected via corresponding connecting lines to an external supply circuit, for example, a measurement transmitter feed unit, a power isolator or a power supply, from which the electronics is supplied with electrical energy during operation. Examples of such measuring systems known per se to those skilled in the art are disclosed in, among others, Published International Applications WO-A 88/02853, WO-A 88/02476, U.S. Pat. No. 6,452,493, US-A 2011/0317390, the European Patents EP-A 816 807, and EP-A 1 591 977 or US-A 2010/0101817, respectively are buyable from the applicant, for example, under the marks, FLOWPHANT®T DTT31, t-switch ATT11, t-trend ATT12, Magphant DTI200, Promag 53H, Prowirl 73F, Promass 83X, or Promass 84F.

The device electronics of such field devices are most often accommodated in a comparatively robust, for instance, impact-, pressure-, explosion- and/or weather resistant, electronics housing. The electronics housing can be arranged e.g. removed from the field device and connected with the field device only via a flexible cable; it can, however, also be arranged directly on the measuring transducer or on a measuring transducer housing separately housing the measuring transducer. For display of measured values on-site, such electronics have, furthermore, most often also a display element placed in such electronics housing, for example, an LCD display element, which in modern field devices can, for example, be formed also by means of a combined display/interaction unit, which can, in given cases, also be removable.

In the case of a large number of field devices with measuring transducer used in industrial measurements technology, the measuring transducer is, for producing the measurement signal during operation, additionally so operated by a driver signal generated at least at times by the operating- and evaluating circuit that the measuring transducer acts at least indirectly on the medium, or, however, also practically directly via a probe directly contacting the medium, in a manner suitable for measuring, in order to bring about reactions there corresponding with the process measurement variable respectively to be registered and reacting on the measuring transducer. The driver signal can, in such case, be correspondingly controlled, for example, as regards an electrical current level, a voltage level and/or a frequency. Examples of such active measuring transducers, thus measuring transducers correspondingly converting an electrical driver signal in the medium, include, especially, flow measuring transducers serving for measuring media flowing, at least at times, e.g. flow measuring transducers having at least one magnetic field producing coil driven by the driver signal, or at least one ultrasonic transmitter driven by the driver signal, or, however, also fill level- and/or limit level transducers serving for measuring and/or monitoring fill levels in a container, such as e.g. ones with freely radiating microwave antennas, with a Goubau line or with vibrating immersion element.

The measured values generated by the device electronics are typically provided to corresponding circuit outputs in the form of electrical, digital or analog, measured value signals, for example, in the form of an analog signal current correspondingly modulated in the range from 4-20 mA. Moreover, usual for providing measured values are also so-called frequency outputs, namely circuit outputs encoding the measured values in a pulse sequence frequency of a binary rectangular signal, or also so-called pulse outputs, namely circuit outputs signaling the reaching of an earlier selectable, quantized unit in the form of a pulse. Besides field devices serving principally for registering a physical, measured variable and having, in each case, a measuring transducer, there are additionally field devices, embodied, for example, as a electric motor driven actuator of valves or pumps. These field devices are provided, especially, to set one or more physical process parameters, consequently to engage actively in the respective process, supplementally, however, also to provide internal measuring—and/or setting values on corresponding circuit outputs. Besides circuit outputs of the aforementioned type providing measured values, the device electronics of a modern field device can, at times, also have so-called status—, respectively alarm, outputs and/or also circuit outputs serving for the immediate activating of external electrical devices directly connected to the particular field device, and, consequently acting as relays. Such circuit outputs can be implemented as passive circuit outputs, namely circuit outputs coupled into an electrical circuit driven by a voltage source located externally of the field devices or also as an active circuit output coupled into an electrical circuit driven by a voltage source internal to the field devices. Alternatively or supplementally, field devices can also have circuit outputs for connecting to a fieldbus, for example, a serial fieldbus.

For connecting internal electrical, respectively electronic, circuits, namely electrical, respectively electronic, circuits accommodated within the electronics housing, not least of all also circuit outputs of the above mentioned type, with one or more external electrical circuits, for example, also the mentioned external supply circuits, field devices have, in each case, a connection apparatus for the electrical connecting of a two or multiline connection cable leading to the field device, consequently a connection cable running at least partially externally of the respective electronics housing. Such connecting apparatuses of field devices are sometimes formed by means of a plug connector, of which a first plug connector part is electrically connected to the particular circuit of the field device and at the same time is secured to a platform placed within the electronics housing, for example, an electronics insert or a circuit board, and a second plug connector part complementary to the first plug connector part is connected with the connection cable. In operation of the respective field device, the plug connector parts are connected fixedly as well as releasably with one another to form an electrical current path leading from the connection cable to the device electronics. In the case of plug connectors of the type being discussed, the first plug connector part is most often embodied as an installed plug and the second plug connector part correspondingly as a socket, in such a manner that the first plug connector part has at least one contact pin electrically connected to the circuit of the field device and the second plug connector part at least one contact socket electrically connected with at least one conductor of the connection cable, and that the two plug connector parts are so connected with one another that the at least one contact socket of the second plug connector part is plugged onto the at least one contact pin of the first plug connector part to form a mechanical connection based on a frictional interlocking and at the same time electrically well conductively contacts the contact pin as a result of an areal pressure produced between contact socket and contact pin to form an electrical connection in the form of a plug contact. By application of such plug connectors, the electrical connecting of a field device to external electrical circuits, respectively the respective connecting lines, is significantly simplified and, at the same time, the failure susceptibility of the electrical current path typically first established on-site by means of the respective plug connector can be kept very small, for example, also by embodying the plug connector according to the known poka yoke principle. Conversely, an electrical current path formed by means of such a plug connector can also be very quickly interrupted by withdrawing the at least one contact socket of the second plug connector part from the contact pin of the first plug connector part along a predetermined track, in order to separate the second plug connector part from the first plug connector part using a removal force acting in the direction of the track.

A disadvantage of such plug connectors is, however, that they, not least of all because of the way they function, develop most often only very low holding forces, respectively that, conversely, just a low removal force acting on the second plug connector part can bring about a separating of the second plug connector part from the first plug connector part. This can, for example, also lead to the fact that such plug connectors can, from vibrations of the electronics housing from whatever source, for instance, caused by shaking movements of the respective container transferred to the field device, automatically loosen, with this leading to a sudden failure of the field device due to interrupted electrical current paths. There exist, consequently, also corresponding specifications for device safety of such connecting apparatuses of field devices conforming, for example, also to one of the established standards C22.2 No 213-M1987, ANSI/ISA-12.12.01-2010, FM3611-2004, respectively IEC 60079-15:2010, according to which in a field device for separating the two plug connector parts of a plug connector of the type being discussed a removal force of at least 15 N (Newton) must be offered, respectively, conversely, with removal forces of less than 15 N acting on the second plug connector part no separating of the plug connector, consequently no removal of the contact socket of the second plug connector part from the at least one contact pin of the first plug connector part is allowed to happen. Moreover, however, also holding forces exerted by such plug connectors and having originally sufficient magnitude can in the course of time, not least of all as a result of material fatigue, gradually lessen.

SUMMARY OF THE INVENTION

Taking the above into consideration, an object of the invention is to provide a field device connector apparatus, in the case of which, on the one hand, an automatic releasing of the plug connector during operation of the field device—, for instance, in such a manner that its second plug connector part would undesiredly separate from the first plug connector part—is safely prevented, and in the case of which, on the other hand, the plug connector can for the purpose of connecting connection cable and electronics be simply handled, respectively for the purpose of separating connection cable and device electronics can, in simple manner, be released again, utilizing as small as possible removal forces.

For achieving the object, the invention resides in a connection apparatus for electrically connecting a circuit of a field device, for example, a field device circuit accommodated in an electronics housing, with a connection cable, for example, a connection cable extended at least partially externally of an electronics housing of the field device and/or a two- or multiline, connection cable. The connection apparatus of the invention comprises a platform, for example, a platform composed at least partially of an electrically insulating plastic, a plug connector having a first plug connector part secured to the platform and electrically connected to the circuit of the field device and a second plug connector part connectable with the connection cable and complementary to the first plug connector part, as well as a lid, for example, a lid at least partially composed of an electrically insulating plastic, for at least partially covering the plug connector, wherein the lid is held movably relative to the platform, for example swingably about an axis. The first plug connector part includes at least one contact pin electrically connected to the circuit of the field device and the second plug connector part includes at least one contact socket, for example, a contact socket electrically connectable with at least one conductor of the connection cable. The first plug connector part and the second plug connector part are additionally releasably connected with one another, for example, also in such a manner that the at least one contact socket of the second plug connector part is plugged onto the at least one contact pin of the first plug connector part to form a frictional interlocking and contacts such electrically conductively. The lid of the connection apparatus of the invention is swingable between a first end position, in which the lid at least partially covers the plug connector, for example, also to form a shape-blocking between lid and second plug connector part, and a second end position and additionally adapted, in at least one open position located between the first end position and the second end position to expose the plug connector such that the at least one contact socket of the second plug connector part is withdrawable from the at least one contact pin of the first plug connector part along a predetermined track, such that the second plug connector part is separated from the first plug connector part, for instance, utilizing a removal force acting in a direction of the removal track, and at least in the first end position to secure the second plug connector part connected with the first plug connector part; this, for example, also in such a manner that a removal force acting with less than 15 N (Newton) on the second plug connector part effects no removal of the at least one contact socket of the second plug connector part from the at least one contact pin of the first plug connector part, respectively that for the removal of the at least one contact socket of the second plug connector part from the at least one contact pin of the first plug connector part a removal force of greater than 15 N is required.

Moreover, the invention resides in a field device, for example, a field device formed as a measuring- and/or switch device, which comprises the connection apparatus as well as a device electronics, for example, a device electronics electrically connected with the connection apparatus and/or having a circuit electrically connected to the at least one contact pin of the first plug connector part.

Furthermore, the invention resides also in a method for connecting at least one electrical connection cable to the field device, which method comprises at least one of the following steps:
  electrically connecting the connection cable to the second plug connector part;
  connecting at least one conductor of the connection cable with the at least one contact socket of the second plug connector part for electrically connecting the connection cable to the second plug connector part;
  swinging of the lid into the open position for separating the second plug connector part from the first plug connector part;
  separating the second plug connector part from the first plug connector part;
  swinging of the lid into the open position for connecting the second plug connector part with the first plug connector part;
  connecting the second plug connector part with the first plug connector part, for example, in such a manner that the at least one contact socket of the second plug connector part is plugged onto the at least one contact pin of the first plug connector part;
  swinging of the lid into the first end position for affixing the second plug connector part into the first plug connector part;
  engaging a locking element of the lid located in the first end position in a corresponding locking element of the platform for affixing the lid and/or for forming a snap connection between platform and lid.

In a first embodiment of the connection apparatus of the invention, it is, furthermore, provided that the lid has at least one locking element, especially a hook shaped locking element, and that the platform has a locking element, for example, a hook shaped or grommet shaped locking element, corresponding to the at least one locking element of the lid. Developing this embodiment of the invention further, the lid is, furthermore, adapted in the first end position to engage shape-interlockingly, for example, with automatic engagement retention, equally as well releasably and/or with snap connection formation, with the at least one locking element in the corresponding locking element of the platform.

In a second embodiment of the connection apparatus of the invention, it is, furthermore, provided that the lid, for example, namely on an inner side facing the plug connector, has at least one contact region, namely a portion, which is adapted to contact the second plug connector part connected with the first plug connector part, and that the second plug connector part connected with the first plug connector part, for example, on an outer side facing the lid, has at least one contact region corresponding to the contact region of the lid, namely a portion, which is adapted to contact the contact region of the lid. Developing this embodiment of the invention further, the lid is, furthermore, adapted in the first end position with at least the contact region to contact the, for example, complementary, contact region of the second plug connector part, for example, to form a shape-blocking to counteract removal of the second plug connector part from the first plug connector part (19). The contact region of the lid can, for example, have a shape complementary to a shape of the contact region of the second plug connector part, for instance, in such a manner that in the first end position of the lid in cooperation of the contact region of the lid and the contact region of the second plug connector part a shape-blocking between lid and second plug connector part is formed opposing removal of the second plug connector part from the first plug connector part. The contact region of the lid can, furthermore, however, also have at least one formed element, for example, a pin shaped or web shaped element, which in the first end position of the lid contacts the contact region of the second plug connector part, especially to form a shape-blocking between the lid and the second plug connector part.

In a third embodiment of the connection apparatus of the invention, the lid and the second plug connector part are, furthermore, adapted in the first end position of the lid to form a shape-blocking to counteract removal of the second plug connector part from the first plug connector part.

In a fourth embodiment of the connection apparatus of the invention, the lid is, furthermore, adapted in the first end position to secure the second plug connector part connected with the first plug connector part, in that the lid holds the second plug connector part pressed against the first plug connector part.

In a fifth embodiment of the connection apparatus of the invention, the platform and the lid are, furthermore, adapted in the first end position of the lid to form a snap connection.

In a sixth embodiment of the connection apparatus of the invention, the first plug connector part is embodied as an installed plug and/or the second plug connector part is embodied as a socket.

In a first further development of the field device the invention, such additionally comprises an electronics housing, for example, an electronics housing at least partially composed of an electrically insulating plastic, wherein both the connection apparatus as well as also the device electronics are accommodated within the electronics housing, for example, in such a manner that the lid of the connection apparatus is positioned in the first end position. In an embodiment of this further development of the invention, it is, furthermore, provided that the electronics housing comprises a, for example, box-shaped or pot-shaped, housing foundation as well as a housing closure closing the housing foundation, for example, a housing closure composed at least partially of a synthetic material and/or fixable releasably to the housing foundation especially by means of screwed connection. Alternatively or supplementally to this, it is, furthermore, provided that the housing closure has at least one contact region, namely a portion, which is adapted to contact the lid located in first end position, and that the lid has at least one contact region corresponding to the contact region of the housing closure, namely a portion, which is adapted to contact the contact region of the housing closure. Said housing closure can, furthermore, be adapted, with at least the contact region, to contact the corresponding contact region of the lid, especially to form a force- and/or shape-blocking to counteract a swinging of the lid out of the first end position; and/or can, furthermore, be so embodied that its contact region has at least one formed element, for example, a pin shaped or web shaped, formed element, which is adapted to contact the contact region of the lid located in the first end position, for instance, also to form a shape-blocking between housing closure and lid, especially in such a manner that the formed element secures the lid in the first end position.

In a second further development of the field device of the invention, such further comprises a measuring transducer, especially a measuring transducer electrically connected to the device electronics, for producing at least one measurement signal dependent on a physical measured variable to be registered and/or a connection cable electrically connected with the device electronics by means of the connection apparatus, for example, a connection cable also extending externally of the electronics housing and/or a two- or multi-conductor connection cable and/or a connection cable electrically connected with the at least one contact socket of the second plug connector part.

In the case of the connector apparatus of the invention, respectively in the case of the field device of the invention, a second connecting plug part plugged into a first connecting plug part to form a plug connector is supplementally secured with the assistance of a swingable lid. The inner side of the lid is so formed that it supplementally secures the connecting plug in its plugged-in position. In the case of closed lid, an unintentional removal of the connecting plug is prevented. In the case of closed lid, the second plug connector part can be pulled out from the first plug connector part only with the application of great force, namely only with a removal force of more than 15 N (Newton), respectively only by destroying the connection apparatus. Requirements of device safety, according to which a removal force of at least 15 N (Newton) must be required for the removal of the second plug connector part from the first plug connector part, can be fulfilled with the assistance of the swingable lid, thus, in very simple, equally as well very effective, manner. The lid enables an additional securing of the second plug connector part connected with the first plug connector part in the so achieved, installed position. The lid can additionally be adapted to cover the first plug connector part and the plugged in, second plug connector part at least partially, so that an additional contact protection is created, in such a manner that a user is prevented from unintentionally touching the plug connector, not least of all also its voltage-carrying regions.

BRIEF DESCRIPTION OF THE DRAWINGS

The invention as well as other advantageous embodiments thereof will now be explained in greater detail based on examples of embodiments, which are shown in the figures of the drawing. Equal parts are provided in all figures with equal reference characters; when perspicuity requires or it otherwise appears sensible, already mentioned reference characters are omitted in subsequent figures. Other advantageous embodiments or further developments, especially also combinations, of initially only individually explained aspects of the invention, will become evident, furthermore, from the figures of the drawing, as well as also the dependent claims per se. The figures of the drawing show as follows:

FIG. 1b is a schematically in a perspective side view, an electronics housing suitable for a field device according to FIG. 1a;

FIG. 4 is a sectional illustration, a lid of the connection apparatus shown in FIGS. 2a, 2b, 3a, 3b, respectively 3c;

DETAILED DISCUSSION IN CONJUNCTION WITH THE DRAWINGS

Figure 1A:
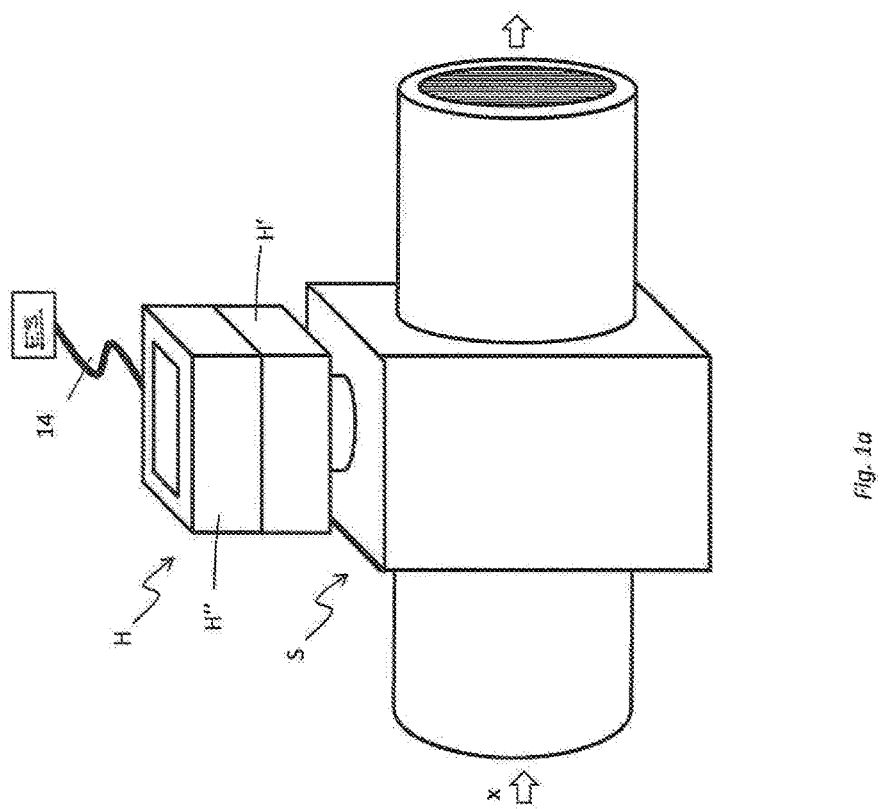
FIG. 1a is a schematically in a perspective side view, a field device formed by means of a measuring transducer installed in the course of a pipeline and a device electronics electrically connected with such.

FIG. 1a shows the principle construction of a field device, for example, a field device formed as a measuring device for flow measurement. The field device can serve as indicated in FIG. 1a e.g. for determining a measured variable x of a medium, for example, a liquid or a flowable dispersion, flowing in a pipeline. For such purpose, the field device includes a measuring transducer S for producing at least one measurement signal dependent on the measured variable x to be registered. In the example of an embodiment shown in FIG. 1a, the measuring transducer S is formed by means of a measuring tube insertable into the course of the pipeline and, consequently, flowed-through during operation by the medium conveyed in the pipeline. The field device can, accordingly, for example, also be a magneto inductive flow measuring device (MID) suitable for measuring a volume flow rate. In the case of such a flow measuring device, the measuring of the volume flow rate occurs, as is known, based on a measurement voltage serving as measurement signal and induced by a magnetic field passing through the measuring tube, and, consequently, through the therein flowing medium, perpendicular to the flow direction. The measurement voltage has a voltage level dependent on an instantaneous flow velocity of the medium, respectively the volume flow rate derived therefrom and is sensed by means of two electrodes provided in the measuring transducer.

Figure 1B:
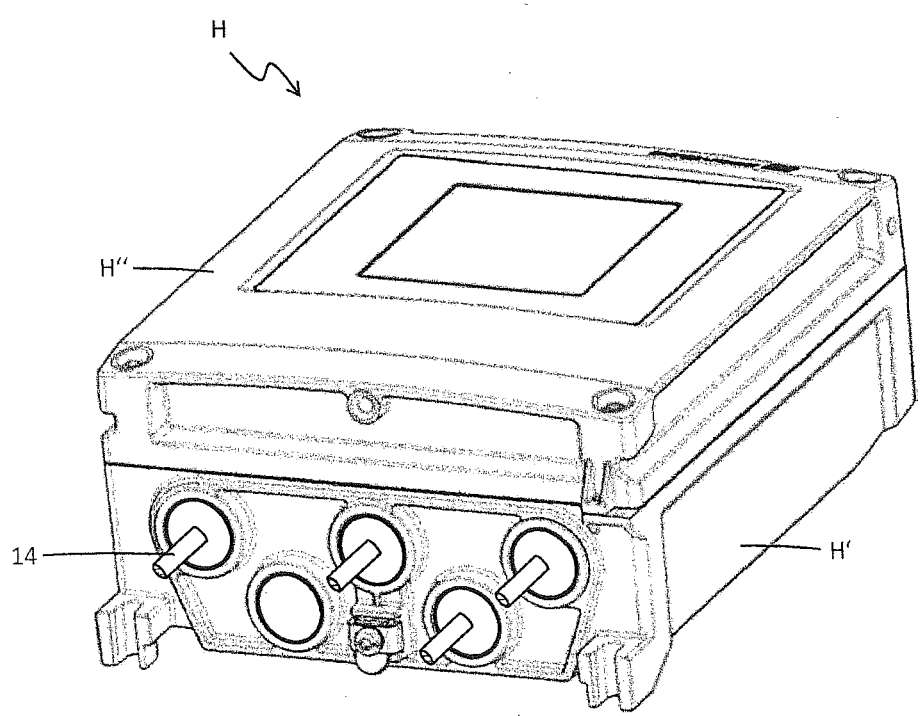

For processing the at least one measurement signal dependent on the respective measured variable to be ascertained, for example, thus the previously indicated measurement voltage, not least of all also for conversion of such measurement signal into corresponding measured values, for example, thus measured values for the volume flow rate, the field device comprises, accommodated in an electronics housing H, a device electronics, which is correspondingly electrically connected to the measuring transducer S. The electronics housing H includes a housing foundation H' as well as a housing closure H" closing such. The housing foundation H' can, such as quite usual in the case of electronics housings for field devices, for example, be embodied pot shaped or, such as evident from a combination of FIGS. 1a, 1b and 6, for example, also rather box shaped. The housing foundation H' and/or the housing closure H" can, furthermore, for example, in each case, be a formed part manufactured of a metal, for example, a steel or an aluminum alloy. The housing foundation H' and/or the housing closure H" can, for example, however, also be, in each case, at least partially or completely manufactured of a plastic. Housing foundation H' and housing closure H" can additionally, in each case, be manufactured by means of one of the primary forming methods correspondingly adapted to the respectively used material, for example, by casting, pressure casting or injection molding. The housing closure H", for example, also a housing closure H" manufactured from the same material as the housing foundation, can, as indicated in FIG. 1b, be secured releasably to the housing foundation H' by means of two or more, for example, four, screw connections.

For additional processing of the respective measurement signal, the device electronics shown here includes a centrally arranged, measurement amplifier 1. The measurement amplifier 1 can be formed, for example, by means of an instrument amplifier circuit and be additionally adapted to register the at least one measurement signal, for example, the mentioned measurement voltage, largely reaction freely and thereafter to amplify it. Placed above the measuring amplifier 1 is, furthermore, a display and interaction unit 2, which includes, for example, a display element 3 embodied as an LCD display as well as an interaction element 4 formed by means of optical input keys. By means of the display element 3, for example, a currently measured value for the measured variable, here, for example, the volume flow rate, and/or setting values of various operating parameters of the field device can be displayed. With help of the interaction element 4 a service person can provide corresponding inputs for control and/or programming of the device electronics. The respectively ascertained measured value can additionally, for example, also be transmitted via a fieldbus to a central control computer or to a programmable logic controller (PLC). For this, there is provided in the device electronics an IO circuit board 5, namely, embodied on a circuit board, an in/output circuit, with which the device electronics, consequently the field device formed therewith, can be connected to a fieldbus. The IO circuit board 5 is designed to convert measured values into a data telegram suitable for the fieldbus, namely a data telegram corresponding to a respective fieldbus protocol. Different types of IO boards are available, which support different fieldbus protocols, such as, for example, HART, Profibus, ModBus, Ethernet IP, etc. The IO circuit board 5 shown in FIGS. 2a, 3a, respectively 4a by way of example includes, for example, an Ethernet plug 6 as well as two, in each case, four poled socket connections 7, 8, via which the device electronics, consequently the field device formed therewith, can, for example, be connected to a serial fieldbus. The first four poled socket connection 7 includes mounted on the IO circuit board 5 an installed plug 9, into which a corresponding connecting plug 10 is insertable. The second four poled socket connection 8 likewise includes mounted on the IO circuit board 5 an installed plug 11, in which a corresponding connecting plug 12 is insertable. The two four poled connecting plugs 10, 11 are, in each case, equipped with four spring clamp terminals for the connection of individual conductors of corresponding connecting cables.

Figure 2A:
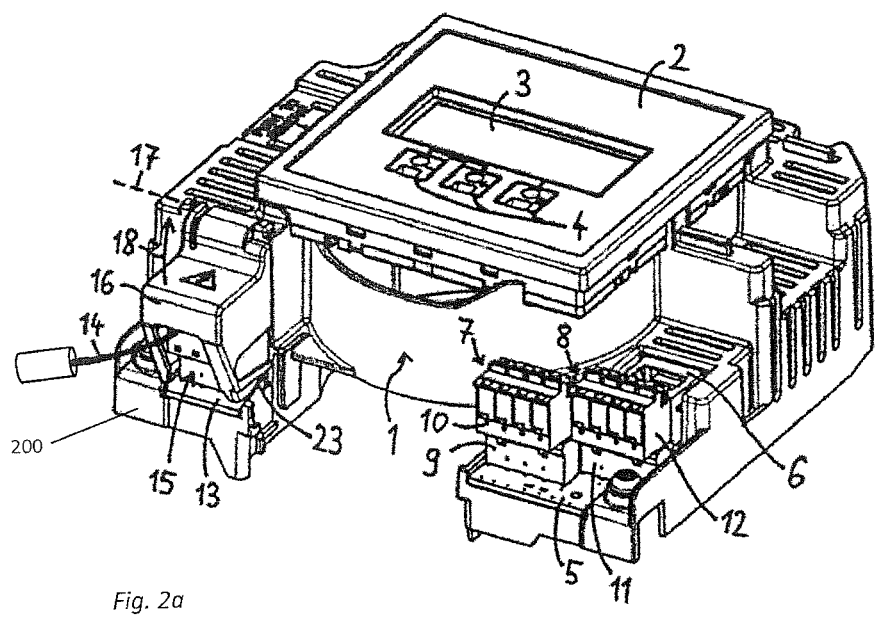
FIGS. 2a, 2b, 3a, 3b, 3c, in each case, shows schematically in a perspective side view, a device electronics suitable for a field device according to FIG. 1a as well as a connection apparatus electrically connected therewith for electrically connecting a connection cable with a circuit of the device electronics.
Figure 3A:
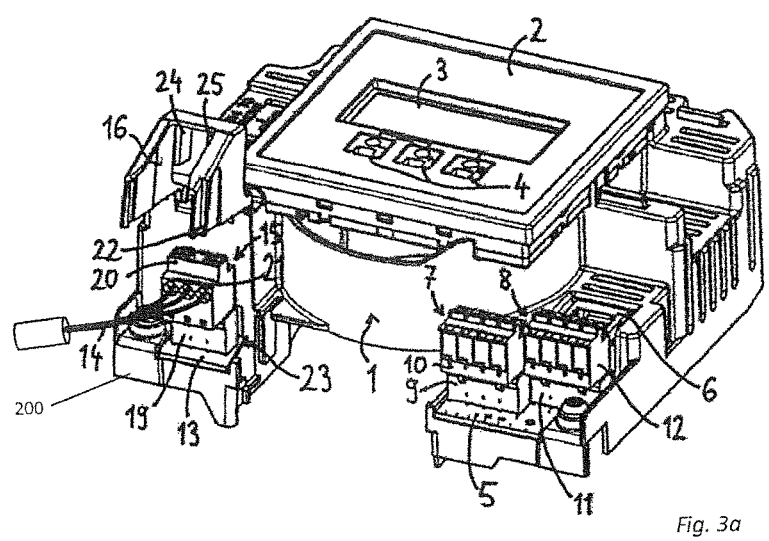

The device electronics shown in FIGS. 2a, 3a, and 4a includes, moreover, a power supply board 13, namely a circuit of the device electronics, respectively of the field device formed therewith, embodied on a circuit board and embodied as a power supply, which is operated with a supply voltage provided by an external supply circuit ES remote from the field device, for example, a measurement transmitter power supply, a feed isolator or an alternating electrical current power supply. Power supply board 13 arranged in the example of an embodiment shown here alongside the measurement amplifier 1 is adapted to provide the different operating voltages required by the device electronics, respectively the field device formed therewith, during operation, for example, voltages of less than 20 V (volt). In the example of an embodiment shown here, the power supply board 13 is adapted to be operated with grid voltage, for example, thus with 230 V~60 Hz (hertz), as supply voltage.

The supply voltage is fed to the power supply board 13 via a connection cable 14, for example, one formed by means of a two- or multiline cable, electrically connected to the supply circuit ES, and, consequently, extending partially externally of the electronics housing of the field device and further via a connection apparatus electrically connected thereto during operation. For electrically connecting the connection cable 14 with the power supply board 13, the connection apparatus comprises a platform 200, especially a platform 200 at least partially composed of an electrically insulating plastic and/or formed as an electronics insert at least partially encapsulating the device electronics, as well as a plug connector 15 mounted thereon. The plug connector 15 comprises a first plug connector part 19 secured to the platform 200 and at the same time electrically connected to the power supply board 13 as well as a second plug connector part 20 connectable with the connection cable 14, respectively connected during operation and complementary to the first plug connector part 19.

The plug connector part 19 includes at least one contact pin 19' electrically connected to the circuit of the field device, while the plug connector part 20 comprises at least one contact socket 20', here namely electrically connectable, respectively connected, during operation, with at least one conductor of the connection cable 14. Moreover, the plug connector part 19 and the plug connector part 20 are, as also directly evident from a combination of FIGS. 2a, 2b, 3a, 3b, 3c, 4a, 4b and 6, releasably connected with one another; this, especially, in such a manner that the at least one contact socket 20' of the plug connector part 20 is plugged onto the at least one contact pin 19' of the plug connector part 19 to form a frictional interlocking and electrically conductively contacts such. The plug connector part 19 can—such as schematically shown—accordingly, for example, also be embodied as an installed plug, while the plug connector part 20 can be, for example, a socket.

Figure 3B:
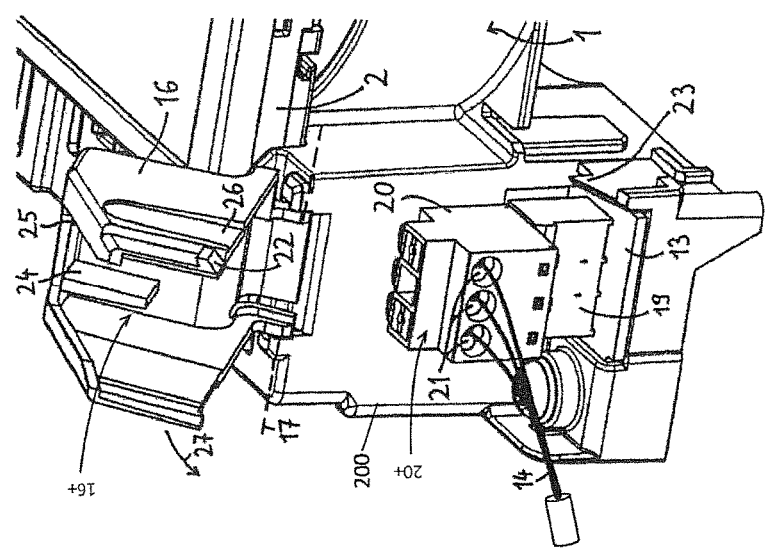
Figure 3C:
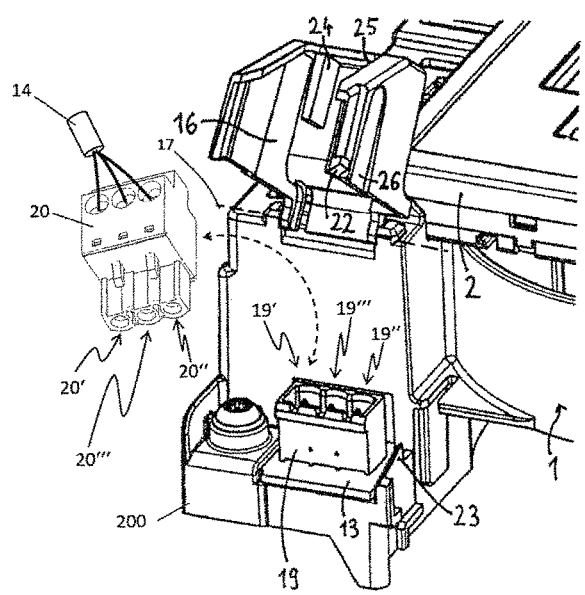

Since in the example of an embodiment shown here, the connection cable 14 to be connected by means of the connection apparatus serves for supplying the supply voltage, the plug connector part 19 has, such as indicated in FIG. 3c, supplementally to the contact pin 19', at least one additional—second—contact pin 19" and the plug connector part 20 has, supplementally to the contact socket 20', at least one other—second—contact socket 20". In the case of supplying the device electronics with grid voltage, then, for example, the line conductor (L) can be connected to the contact socket 20' and the neutral conductor (N) to the additional contact socket 20" and, thus, both are led via the corresponding contact pin 19', respectively 19", further to the power supply board 13. Additionally, also the, in given cases, provided protective conductor (PE) can be connected via the plug connector 15—namely via another—third—contact socket 20''' as well as corresponding—third—contact pin 19''' with the power supply board 13. Alternatively or supplementally, the protective conductor (PE) can be connected, for example, also to a grounded piece of sheet metal (not shown).

For connecting the connection cable 14 to the plug connector part 20 embodied, for example, as a socket, plug connector part 20 can have, furthermore, e.g. corresponding —, for example, thus two or three—spring clamp elements 21, of which each is electrically connected with a respective one of the contact sockets 20', 20", 20''' and in which the individual conductors (formed, for example, as Litz, respectively as solid, wires) of the connection cable 14 are tightly clamped. Plug connector part 20 accordingly includes in the example of an embodiment shown in FIG. 3b exactly three spring clamp elements 21 for tight clamping of the individual conductors of the connection cable 14. In such case, the connection cable 14 can, for example, however, also be designed as an only two conductor cable, of which a first conductor for the line conductor (L) is connected to the first contact socket 20' and a second conductor for the neutral conductor (N) is connected to the contact socket 20", in such a manner that the likewise present—third—contact socket 20' is unused. Alternatively thereto, the connection cable 14 can, however, for example, also be designed as a three line cable, which supplementally to the conductors for the line conductor and the neutral conductor includes, connected with the contact socket 20''', a third conductor for the protective conductor (PE).

For plug connectors of the type being discussed, it is regularly required that for separating such a plug connector, here namely for the removal of the plug connector part 20 from the plug connector part 19, respectively for pulling the at least one contact socket 20' from the at least one corresponding contact pin 19', a removal force of at least 15 N (Newton) must be exerted, respectively that with a removal force of less than 15 N acting on the second plug connector part 20 no removal of the plug connector part 20 from the plug connector part 19, consequently no removal of the contact socket 20' from the contact pin 19', is effected. By such a requirement, it is intended that an overly easy, in given cases, also automatic releasing, of the plug connector part 20 from the plug connector part 19, consequently an unintentional separating of the plug connector 15 during operation of the field device, can be prevented. Additionally, it is not permitted that the plug connector part 20 can be mistakenly pulled out, since this can represent an increased safety risk, especially in the direct vicinity of an electrically conductive liquid.

In order to fulfill this requirement for device safety, respectively to assure that a removal force of at least 15 N is required for removing the plug connector part 20, the connection apparatus of the invention includes, as evident from FIGS. 2a and 2b, 3a, 3b, and 3c, respectively their combination, furthermore, a lid 16 for at least partially covering the plug connector 15. Lid 16 is held movably on the platform 200—here namely swingably, or pivotably, about an axis 17—, and is at least partially composed, for example, of an electrically insulating plastic.

Shown enlarged in FIG. 4 are the lid 16 as well as the bearing seats provided on the platform 200 for defining the axis 17, respectively for the swingable mounting of the lid 16. The lid 16 can—such as already indicated—, for example, be embodied as a formed plastic part. For the pivotable seating of the lid 16, such includes a first mounting section 28 with a first pin 29 as well as a second mounting section 30 with a second pin 31. A gap 32 is located between the—here right—mounting section 28 and the—here left—mounting section 30. The mounting section 30 is embodied essentially more narrowly than the mounting section 28 and can, consequently, due to the gap 32, be resiliently deformed to a certain degree. As further evident from FIG. 4, the seating shown here for the lid 16 comprises a recess 33, a first bearing seat 34 for the pin 29 as well as a second bearing seat 35 for the pin 31. For mounting the lid 16 into the seating, the mounting section 30 can be elastically deformed, so that the two pins 29, 31 can pass into the corresponding bearing seats 34, 35 and thereafter by letting the mounting section 30 return to its starting shape the two pins 29, 31 become rotatably seated in the bearing seats 34, 35.

Figure 2B:
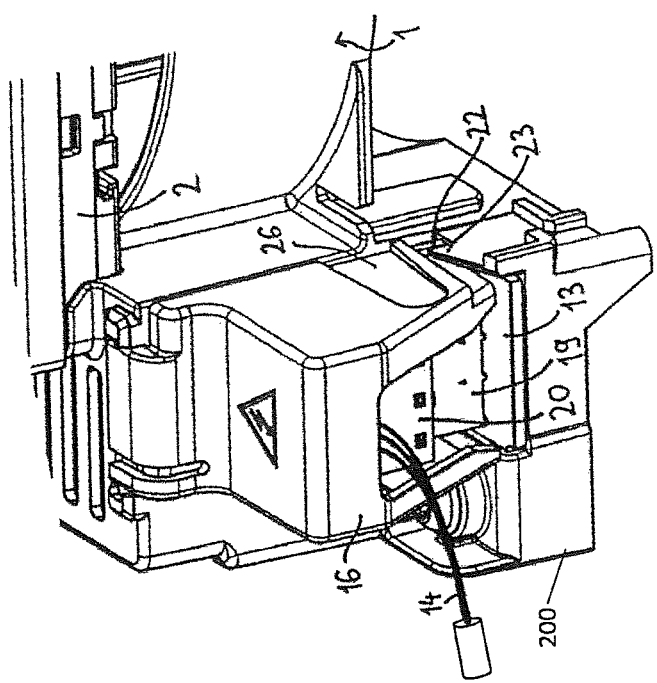

The lid 16 can—such as directly evident from a combination of FIGS. 2a, 2b as well as 3a, 3b—be swung between a first end position, in which the lid 16 at least partially covers the plug connector (FIG. 2a; FIG. 2b), and a second end position (FIG. 3a; FIG. 3b). In the example of an embodiment shown here, lid 16 can, for example, be pivoted around the axis 17 in the direction of the arrow 18—in FIG. 2a, respectively 2b namely upwardly—, respectively opposite to the direction of the arrow 18—in FIG. 3a, respectively 3b namely downwards—and so from the first end position shown in FIG. 2a, respectively 2b, into an opened position —, for example, namely into the second end position.

The lid 16 of the connection apparatus of the invention is, especially, furthermore, adapted to be able to be swung into at least one open position located between the first end position and the second end position and in the open position—which is, in given cases, also coincident with the second end position—to expose the plug connector 15 to the extent that the at least one contact socket 20' of the second plug connector part 20 can be withdrawn from the at least one contact pin 19' of the first plug connector part 19 along a predetermined removal track, in that the second plug connector part 20, with application of a removal force acting in the direction of the removal track, is, as indicated in FIG. 3c, separated from the first plug connector part 19. In an additional embodiment, the lid 16 is—not least of all for the protection of a service person against accidental contact with the supply voltage, in given cases, lying also above an allowable touch voltage, even in the case of opened electronics housing—, furthermore, additionally also adapted in the first end position to cover at least the plug connector part 20 connected with the first plug connector part 19, consequently the so formed plug connector 15, to the extent that even in the case of opened electronics housing a touching of voltage-carrying parts of the connection apparatus is prevented. In the example of an embodiment shown here, the lid 16 is—such as directly evident from the situation shown in FIG. 2a, respectively 2b—so embodied that in the first end position it almost completely covers, respectively almost completely encases, the plug connector 15.

In FIGS. 3a and 3b, respectively 3c, the lid 16 is, in each case, shown in an opened position—in FIG. 3b, respectively 3c, namely, in each case, in an open position coincidental with the second end position—wherein FIGS. 3a and 3b show, in each case, the lid 16 in an open position when at the same time plug connector part 20 is plugged onto the plug connector part 19. Shown additionally is that the plug connector part 19 of the plug connector 15 is mounted directly on the power supply board 13 and that the plug connector part 20 in the case of lid swung into the open position can be plugged together with the plug connector part 19, respectively withdrawn therefrom. In the case of removed housing closure H" and at the same time lid 16 swung into the open position, the plug connector 15 is exposed to the extent that its plug connector part 20 can be easily pulled out of the plug connector part 19 by a service person, for instance, in order to isolate the device electronics from the supply circuit, respectively from the grid. The service person can additionally also in the case of lid swung into the open position plug the plug connector part 20 back onto the plug connector part 19, in order, in this way, to connect the device electronics electrically with the connection cable, respectively to connect the field device electrically to the supply circuit. After plugging the plug connector part 20 into the plug connector part 19, the lid 16 can be closed by swinging it from the open position into the first end position. This is schematically illustrated in FIG. 3b by the arrow 27. Then, additionally, also the housing closure H" can be screwed back onto the housing foundation H'.

Furthermore, the lid 16 of the connection apparatus of the invention is also provided, respectively adapted, at least in the first end position to secure the connected plug connector part 20 to the plug connector part 19; this, especially, in such a manner that a removal force acting with less than 15 N on the second plug connector part 20 effects no removal of the at least one contact socket of the second plug connector part 20 from the at least one contact pin of the first plug connector part 19, and/or in such a manner that for removal of the at least one contact socket 20' of the plug connector part 20 from the at least one contact pin 19' of the plug connector part 19 a removal force of greater than 15 N is required. For such purpose, the lid includes according to an embodiment of the invention on an inner side facing the plug connector at least one contact region 16+, namely a portion, which is adapted to contact the second plug connector part 20 connected with the first plug connector part 19, and, furthermore, the plug connector part 20 plugged into the plug connector part 19 includes on an outer side facing the lid 16 at least one contact region 20+ corresponding to the contact region 16+ of the lid 16, namely a portion, which is adapted to contact the contact region 16+ of the lid 16.

Advantageously, the portion of the lid 16 lying on the outer side of the plug connector part 20 can, in such case, be complementary to the mentioned outer side and so formed, respectively so embodied, that the mentioned portion of the lid 16 lies at least partially areally on the mentioned outer side of the plug connector part 20 and at the same time obstructs a releasing of the plug connector part 20 from the plug connector part 19, respectively is formed such that its shape counteracts a removal of the plug connector part 20 from the plug connector part 19. In an additional embodiment of the invention, the lid 16 is, consequently, furthermore, adapted to contact the second plug connector part 20 connected with the first plug connector part 19 to form a shape-based blocking between lid 16 and plug connector part 20, especially a blocking counteracting a removal of the plug connector part 20 from the plug connector part 19.

For such purpose, the lid 16 is, according to an additional embodiment of the invention, furthermore, adapted in the first end position with at least the contact region 16+ to contact the—here essentially complementary—contact region 20+ of the plug connector part 20, respectively the contact region 16+ has a shape complementary to a shape of the contact region 20+. Contact region 16+ and contact region 20+ can for achieving a sufficiently high holding force, namely requiring a removal force of at least 15 N, for example, be thus so formed and so embodied that in the case of lid 16 brought into the first end position, the contact regions 16+, 20+ cooperate to form a blocking between lid 16 and the plug connector part 20 based on shape for preventing removal of the plug connector part 20 from the plug connector part 19.

The contact region 16+ of the lid 16 can, furthermore, be so embodied that it has at least one formed element 24, for example, of pin or web shape, which in the first end position of the lid 16 correspondingly contacts the contact region 20+ of the plug connector part 20, respectively that it is formed by means of such a formed element 24. In the example of an embodiment shown in FIGS. 3a, 3b, 3c, a web serves as formed element 24 provided on the inner side of the lid 16 facing the plug connector 15. It serves, consequently, for forming the aforementioned contact region 16+.

Figure 5A:
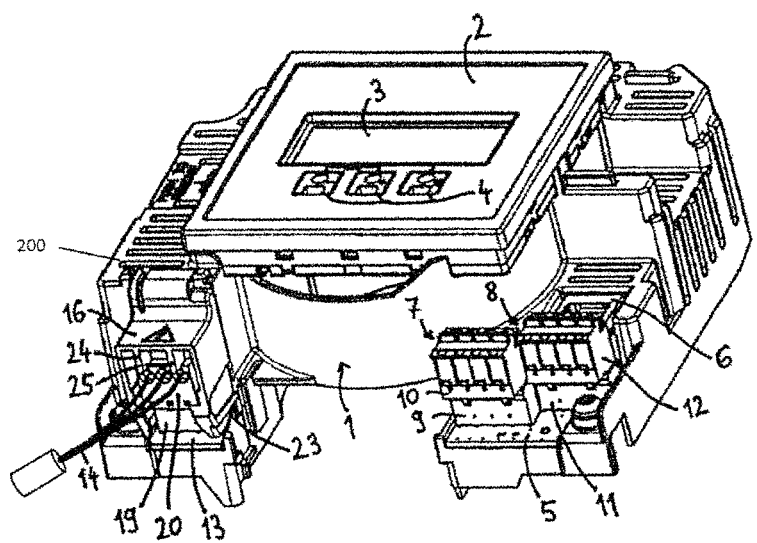
FIGS. 5a and 5b, in each case, shows schematically in a partially sectioned, perspective side view, a device electronics suitable for a field device according to FIG. 1 as well as a connection apparatus electrically connected therewith for electrically connecting a connection cable with a circuit of the device electronics; as well as FIG. 6 is a sectioned perspective side view, an electronics housing suitable for a field device according to FIG. 1b and a connection apparatus accommodated in the electronics housing.
Figure 5B:
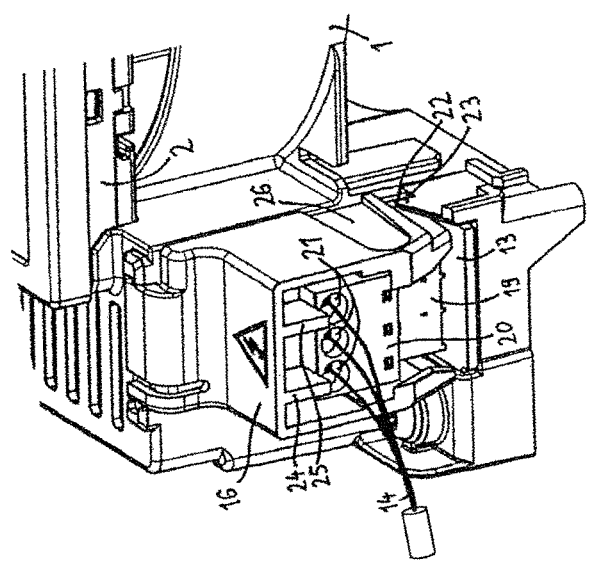

The function of the formed element 24 formed here as a web is yet again made clear in FIGS. 5a and 5b. The lid 16 brought also here, in each case, into the first end position is, in such case, in each case, shown sectioned along an imaginary cutting plane, such that the plug connector placed below the lid 16 can be seen. Plug connector part 20 is correspondingly shown plugged together with the plug connector part 19—here sitting on the power supply board 13. Plug connector part 20 includes three spring clamp elements 21, in which the corresponding conductors —, formed for example, in each case, as solid wire, respectively as Litz wire—of the connection cable 14 are tightly clamped, via which the field device can, in turn, be fed the required supply voltage. For the case illustrated here, in which the lid 16 is placed in the closed position, namely in the first end position, the formed part 24 of the lid 16 lies on the second plug connector part 20, whereby the plug connector 15 is secured against an otherwise possible separating.

As directly evident from a combination of FIG. 5a, respectively 5b, with FIG. 3a, respectively 3b, in the example of an embodiment shown here, besides the formed element 24, a further formed element 25—here formed essentially equally to the formed element 24—is provided on the inner side of the lid 16. Each of the at least two formed elements 24, 25—here namely formed as webs extending essentially parallel to one another—is additionally so formed that its underside—here namely forming the contact region 16+—is embodied at least sectionally complementary to the contact region 20+ of the plugged-in plug connector part 20; this, especially, also in such a manner that in the first end position of the lid 16 each of the two—here, in each case, web shaped—formed elements 24, 25 contacts the second plug connector part 20 areally. In such case, the height of each of the two formed elements 24, 25 is so selected that the respective lower end of each of the two webs 24, 25 areally contacts the contact region 20+ of the plug connector part 20 located therebeneath, whereby, as a result, an automatic, respectively unintentional removal of the plug connector part 20, not least of all also in the case of vibrations of the electronics housing, respectively of the platform 200, is prevented. Moreover, a separation between a respective end of each of the formed elements 24, 25 facing the axis 17 from the axis 17 can, furthermore, be so dimensioned that additionally and supplementally also at least one of these ends in the case of lid 16 located in the first end position contacts an additional corresponding contact region of the plug connector part 20, in order further to improve the holding action of the shape-based blocking between lid 16 and plug connector part 20.

The securing of the plug connector part 20 connected with the plug connector part 19 can, moreover, however, also be supported by other measures, for example, also suppressing a spontaneous opening of the lid 16 during operation of the field device, thus measures such as e.g. corresponding detent elements of the connection apparatus and/or further formed elements provided on the housing closure. In an additional embodiment of the invention, lid 19 and platform 200 are, consequently, furthermore, adapted in the first end position of the lid 16 to form a snap connection, namely such a connection, in the case of which, using respective inherent elasticity of lid 19 and platform 200, a shape-based interlocking is produced between lid 19 and platform 200, which interlocking can, upon actuation, be released.

For forming such a snap connection, the lid in the case of this embodiment of the invention is, especially, also adapted in the first end position by means of at least one locking element 22 to engage in a corresponding locking element 23 of the platform 200 to form a—here self holding, equally as well releasable by actuation—shape-interlocking. As directly evident from a combination of FIGS. 2a and 2b, 3a, 3b, respectively 3c, the locking element 22 of the lid 16 in the example of an embodiment shown here is essentially hook shaped, while the locking element 23 of the platform 200 corresponding to the at least one hook shaped locking element 22 of the lid is formed only by a web provided on the platform 200, respectively a rib provided on the platform. The locking element 23 of the platform 200 can, however, for example, also be essentially hook shaped or, however, also essentially grommet shaped. FIG. 2a, respectively 2b, shows that in the case of lid 16 in the first end position the locking element 22 is engaged in the locking element 23, in that a hook shaped end region of the locking element 22 viewed in the closing direction is placed behind the locking element 23. In order to enable an easy as possible engaging of the locking element 22 in the locking element 23, the hook shaped end region of the locking element 22 is, as, directly evident from FIGS. 3a, 3b and 3c, chamfered on a front side as viewed in the closing direction, in such a manner that in the case of the closing the lid 16 the locking element 23 of the platform 200 is pressed somewhat laterally by said front side, in order thereafter, namely after the hook shaped region has passed the locking element 23, to be able to snap automatically back and so to engage the locking element 23. In this way, the lid 16 is secured in the first end position, whereby also the plug connector 15 located therebeneath is secured against unintentional, respectively automatic releasing. An opening of the lid 16 is in the example of an embodiment shown here, conversely, only possible when a service person presses against a gripping recess 26 formed in the lid 16. As a result of a deformation force exerted thereby on the gripping recess 26, the locking element 22 moves inwardly toward the plug connector 19, respectively away from the locking element 23 of the platform 200. The deformation force must, in such case, be sufficiently large that the locking element 22 is freed completely from the locking element and completely releases the catch mechanism between the two locking element 22, 23. Conversely, the restoring forces brought about by the lid 16, namely restoring forces counteracting deformation allowing an opening of the lid, must be sufficiently high that a spontaneous releasing of the snap closure, respectively a spontaneous opening of the lid 16 during operation of the field device, not least of all also in the case of vibrations of the electronics housing, respectively the therein accommodated device electronics, is safely prevented.

Figure 6:
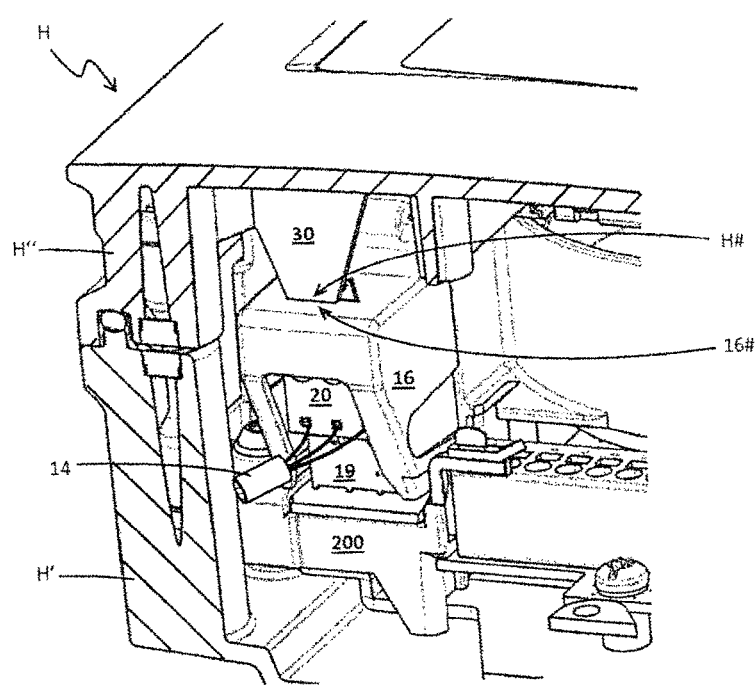

FIG. 6 finally shows another variant of the invention, in the case of which for securing of the lid 16 brought into the first end position, consequently for securing the plug connector assembled by connecting the plug connector part 20 with the plug connector part 19, the housing closure H" and the lid 16 are adapted to contact one another in the installed position, namely in the case of lid 16 located in the first end position and housing closure H" connected with the housing foundation H', especially to contact one another in such a manner that a force—and/or shape interlocking opposing a swinging of the lid out of the first end position is formed between lid and housing closure. For such purpose, the housing closure H" includes on an inner side facing the connection apparatus, respectively the device electronics, at least one contact region H#, namely a portion, which is adapted to contact the lid 16 located in the first end position, and the lid 16 includes on an outer side facing the housing closure at least one contact region 16# corresponding to the contact region H# of the housing closure H', namely a portion, which is adapted, in the installed position, to contact the contact region H# of the housing closure. As shown schematically in FIG. 6, the contact region H# of the housing closure can be formed by providing the housing closure on the inner side facing the connection apparatus, respectively the device electronics, with at least one formed element 30, for example, a pin shaped or web-shaped, formed element 30, which is adapted, in the installed position, to form the contact region H# for contacting the corresponding contact region 16# of the lid 16 located in the first end position, for instance, to form a shape-blocking between housing closure and lid. A so formed shape-based blocking can, moreover, also be so designed that in the installed position the formed element 30 secures the lid 16 in the first end position playfreely, for example, by dimensioning the formed element 30 such that in the installed position it supplementally experiences a deformation force, which effects a small, equally as well sufficient, elastic deformation of the formed element 30 for securing the lid 16 in the first end position.

Particularly in the case of application of the aforementioned formed element 30, however, for example, for the mentioned case, in which a snap connection is formed between the platform and the lid 16 brought into the first end position, the lid 16 and the plug connector 15 can, furthermore, be so matched to one another dimensionally that in the case of lid 16 brought into the end position, the lid and/or the plug connector 15 are so elastically deformed, that, as a result, additional holding forces are produced in the connection apparatus for holding the plug connector part 20 pressed against the plug connector part 19, whereby the plug connector part 20 connected with the plug connector part 19 can be secured even better against a possible releasing from the plug connector part 19. This can be implemented very simply, for example, by a suitably designed height for the formed elements 24, 25.

The invention claimed is:

1. A field device, comprising:
    an electronics housing, said electronics housing including
        a housing foundation and a housing closure closing said housing foundation;
    a device electronics accommodated within said electronics housing; and
    a connection apparatus accommodated within said electronics housing for electrically connecting a circuit of said device electronics with a connection cable extended at least partially covering said plug connector, wherein:

said connection apparatus including a platform, a plug connector and a lid for at least partially covering said plug connector;

said plug connector including a first plug connector part secured to said platform and electrically connected to said circuit and a second plug connector part connectable with said connection cable and complementary to said first plug connector part;

said first plug connector part including at least one contact pin electrically connected to said circuit and said second plug connector part including at least one contact socket;

said first and said second plug connector parts being releasably connected with one another;

said lid being held movably relative to said platform such that said lid is swingable between a first end position, in which said lid at least partially covers said plug connector, and a second end position;

said lid being adapted, in at least one open position located between said first end position and said second end position, to expose said plug connector such that said at least one contact socket of said second plug connector part is withdrawable from said at least one contact pin of said first plug connector part along a predetermine removal track, such that said second plug connector part is separated from said first plug connector part, and said lid being adapted, at least in said first end position to secure said second plug connector part connected with said first plug connector part;

said connection apparatus is accommodated within said electronics housing in such a manner that said lid of said connection apparatus is positioned in said first end position; and said housing closure exhibits at least one contact region, said contact region of said housing closure being adapted to contact said lid located in said first end position, and said lid exhibits at least one contact region corresponding to said contact region of said housing closure, said contact region of said lid being adapted to contact said contact region of said housing closure, said contact region of said housing closure exhibiting at least one formed element, which is adapted to contact said contact region of said lid located in said first end position and to form a shape-blocking between said housing closure and said lid in such a manner that said formed element secures said lid in said first end position.

2. The field device as claimed in claim 1, wherein:
said lid has at least one contact region, said contact region of the lid being adapted to contact said second plug connector part connected with said first plug connector part; and
said second plug connector part connected with said first plug connector part, includes at least one contact region corresponding to the contact region of said lid, said contact region of the second plug connector part being adapted to contact the contact region of said lid.

3. The field device as claimed in claim 2, wherein:
said lid is adapted in the first end position with at least the contact region to contact said contact region of said second plug connector part; and/or
said contact region of said lid exhibits a shape complementary to a shape of the contact region of said second plug connector part; and/or
said contact region of said lid includes at least a formed element, which in the first end position of said lid contacts the contact region of said second plug connector part.

4. The field device as claimed in claim 1, wherein:
said lid and said second plug connector part are adapted in the first end position of said lid to form a shape-blocking to counteract removal of said second plug connector part from said first plug connector part.

5. The field device as claimed in claim 1, wherein:
said lid is adapted in the first end position to secure said second plug connector part connected with said first plug connector part, in that the lid holds said second plug connector part pressed against said first plug connector part.

6. The field device as claimed in claim 1, wherein:
the platform and the lid are adapted in the first end position of the lid to form a snap connection.

7. The field device as claimed in claim 1, wherein:
said housing closure is secured releasably to said housing foundation.

8. The field device as claimed in claim 1, wherein:
said housing closure is adapted, with at least a contact region, to contact the corresponding contact region of said lid, to form a force- and/or shape-blocking to counteract a swinging of said lid out of the first end position.

9. The field device as claimed in claim 1, further comprising:
a measuring transducer, for producing at least one measurement signal dependent on a physical measured variable to be registered; and/or
a connection cable electrically connected with said device electronics by means of said connection apparatus.

10. The field device as claimed in claim 1, wherein:
said lid is adapted, to secure the second plug connector part connected with the first plug connector part in such a manner that a removal force acting with less than 15 N on the second plug connector part effects no removal of the at least one contact socket of the second plug connector part from the at least one contact pin of the first plug connector part.

11. The field device as claimed in claim 1, wherein:
said lid is adapted, to secure the second plug connector part connected with the first plug connector part in such a manner that for removal of the at least one contact socket of the second plug connector part from the at least one contact pin of the first plug connector part a removal force of greater than 15 N is required.

* * * * *